(12) United States Patent
Krumbein et al.

(10) Patent No.: US 9,967,679 B2
(45) Date of Patent: May 8, 2018

(54) SYSTEM AND METHOD FOR AN INTEGRATED TRANSDUCER AND TEMPERATURE SENSOR

(71) Applicant: Infineon Technologies AG, Neubiberg (DE)

(72) Inventors: Ulrich Krumbein, Rosenheim (DE); Alfons Dehe, Reutlingen (DE)

(73) Assignee: Infineon Technologies AG, Neubiberg (DE)

( * ) Notice: Subject to any disclaimer, the term of this patent is extended or adjusted under 35 U.S.C. 154(b) by 170 days.

(21) Appl. No.: 14/613,106

(22) Filed: Feb. 3, 2015

(65) Prior Publication Data

US 2016/0221822 A1 Aug. 4, 2016

(51) Int. Cl.
| | | |
|---|---|---|
| H04R 23/00 | (2006.01) |
| B81B 7/02 | (2006.01) |
| H04R 17/02 | (2006.01) |
| H04R 19/00 | (2006.01) |
| H04R 19/04 | (2006.01) |
| H04R 31/00 | (2006.01) |
| H04R 19/01 | (2006.01) |
| H04R 19/02 | (2006.01) |

(52) U.S. Cl.
CPC ............ *H04R 23/00* (2013.01); *B81B 7/02* (2013.01); *H04R 17/02* (2013.01); *H04R 19/005* (2013.01); *H04R 19/04* (2013.01); *H04R 31/00* (2013.01); *B81B 2201/0257* (2013.01); *B81B 2201/0278* (2013.01); *B81B 2207/015* (2013.01); *H04R 19/013* (2013.01); *H04R 19/016* (2013.01); *H04R 19/02* (2013.01); *H04R 2201/003* (2013.01)

(58) Field of Classification Search
CPC .................. H04R 23/00; H04R 2201/003; H04R 19/013; H04R 19/016; H04R 19/02; H04R 17/02; H04R 19/005; H04R 19/04; H04R 31/00; B81B 7/0083; B81B 7/0087; B81B 2201/0257; B81B 2201/0278; B81B 7/02; B81B 2207/015; B81C 1/00349

See application file for complete search history.

(56) References Cited

U.S. PATENT DOCUMENTS

2009/0169035 A1   7/2009  Rombach et al.
2010/0195851 A1*  8/2010  Buccafusca ............ H04R 17/02
                                                          381/190

(Continued)

FOREIGN PATENT DOCUMENTS

| JP | 2012090224 A | 5/2012 |
| KR | 20080109001 A | 12/2008 |
| KR | 20130125433 A | 11/2013 |

OTHER PUBLICATIONS

Hall, N, et al., "Simulation of Thin-Film Damping and Thermal Mechanical Noise Spectra for Advanced Micromachined Microphone Structures," IEEE Journal of Microelectromechanical Systems, vol. 17, No. 3, Jun. 2008, 10 pages.

*Primary Examiner* — Jason R Kurr
(74) *Attorney, Agent, or Firm* — Slater Matsil, LLP

(57) ABSTRACT

According to embodiment, a transducer includes a microfabricated element integrated on a single die and an interface IC coupled to the microfabricated element. The microfabricated element includes an acoustic transducer and a temperature sensor, and the interface IC is electrically coupled to the acoustic transducer and the temperature sensor.

41 Claims, 10 Drawing Sheets

(56) References Cited

U.S. PATENT DOCUMENTS

| | | | |
|---|---|---|---|
| 2013/0322675 A1* | 12/2013 | Zoellin | H04R 1/04 |
| | | | 381/355 |
| 2014/0112510 A1 | 4/2014 | Yang et al. | |
| 2014/0169405 A1* | 6/2014 | Graham | G01K 7/226 |
| | | | 374/185 |
| 2015/0129992 A1 | 5/2015 | Hur et al. | |
| 2015/0321906 A1* | 11/2015 | Tsai | B81B 7/02 |
| | | | 257/416 |
| 2016/0165330 A1* | 6/2016 | Minervini | G01K 13/00 |
| | | | 374/142 |

\* cited by examiner

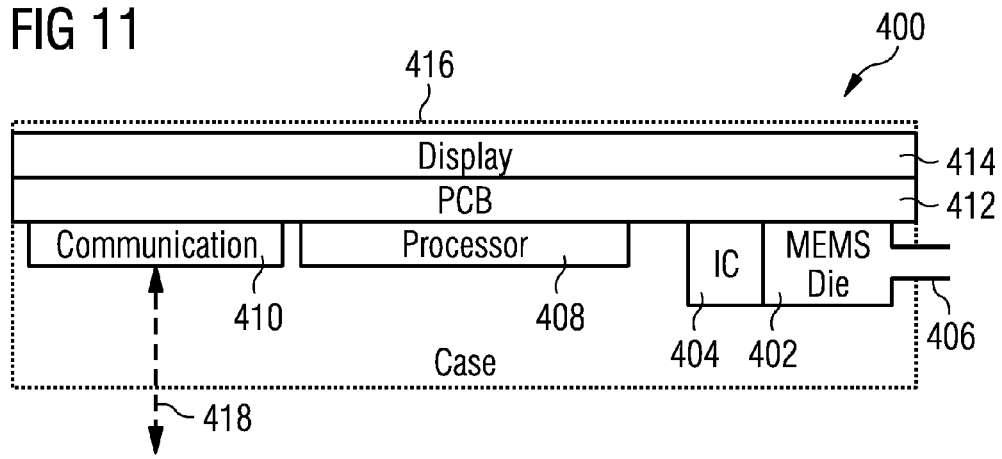
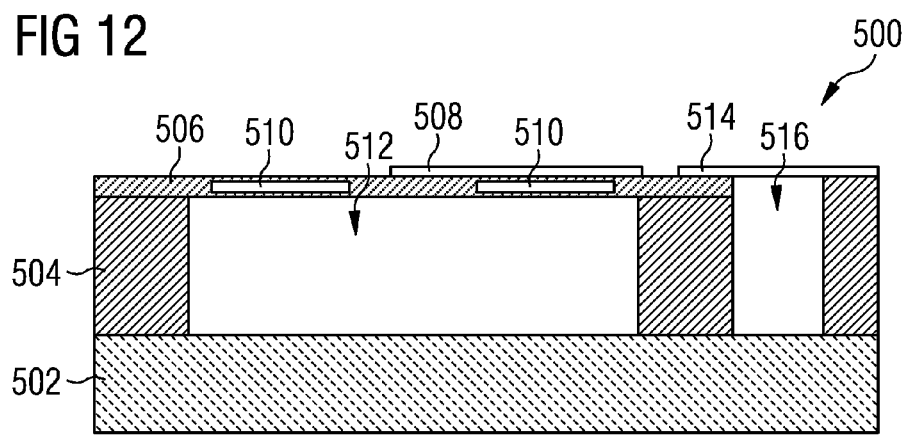
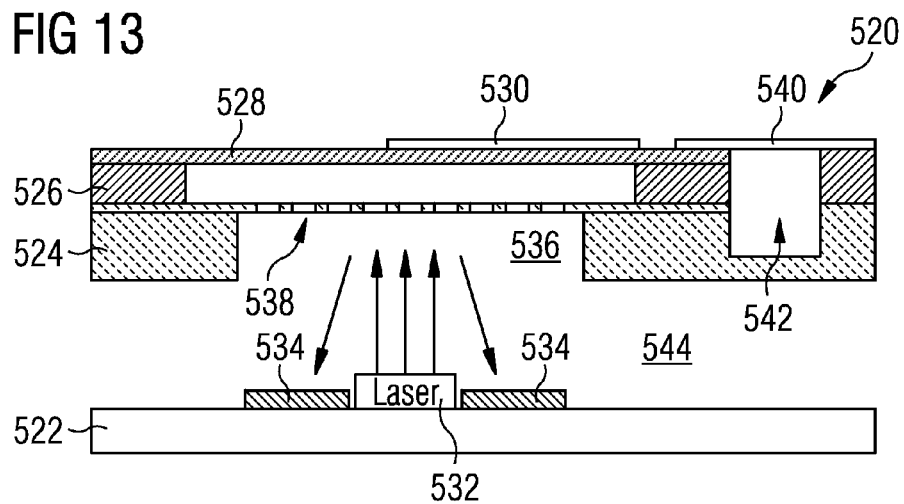

SYSTEM AND METHOD FOR AN INTEGRATED TRANSDUCER AND TEMPERATURE SENSOR

TECHNICAL FIELD

The present invention relates generally to systems and methods for transducers, and, in particular embodiments, to a system and method for an integrated transducer and temperature sensor.

BACKGROUND

Transducers convert signals from one domain to another and are often used in sensors. One common sensor with a transducer that is seen in everyday life is a microphone that converts sound waves to electrical signals. Another example of a common sensor is a thermometer. Various transducers exist that serve as thermometers by transducing temperature signals into electrical signals.

Microelectromechanical system (MEMS) based sensors include a family of transducers produced using micromachining techniques. MEMS, such as a MEMS microphone, gather information from the environment by measuring the change of physical state in the transducer and transferring a transduced signal to processing electronics that are connected to the MEMS sensor. MEMS devices may be manufactured using micromachining fabrication techniques similar to those used for integrated circuits.

MEMS devices may be designed to function as, for example, oscillators, resonators, accelerometers, gyroscopes, pressure sensors, microphones, and micro-mirrors. Many MEMS devices use capacitive sensing techniques for transducing the physical phenomenon into electrical signals. In such applications, the capacitance change in the sensor is converted to a voltage signal using interface circuits.

One such capacitive sensing device is a MEMS microphone. A MEMS microphone generally has a deflectable membrane separated by a small distance from a rigid backplate. In response to a sound pressure wave incident on the membrane, it deflects towards or away from the backplate, thereby changing the separation distance between the membrane and backplate. Generally, the membrane and backplate are made out of conductive materials and form "plates" of a capacitor. Thus, as the distance separating the membrane and backplate changes in response to the incident sound wave, the capacitance changes between the "plate" and an electrical signal is generated.

MEMS microphones are often used in mobile electronics, such as tablet computers or mobile phones. In some applications, it may be desirable to increase the functionality of these MEMS microphones in order to provide additional or improved functionality to the electronic system including the MEMS microphone, such as a tablet computer or mobile phone, for example.

SUMMARY

According to embodiment, a transducer includes a microfabricated element integrated on a single die and an interface IC coupled to the microfabricated element. The microfabricated element includes an acoustic transducer and a temperature sensor, and the interface IC is electrically coupled to the acoustic transducer and the temperature sensor.

BRIEF DESCRIPTION OF THE DRAWINGS

For a more complete understanding of the present invention, and the advantages thereof, reference is now made to the following descriptions taken in conjunction with the accompanying drawings, in which:

FIG. 11 illustrates a system block diagram of an embodiment electronic system;

FIG. 12 illustrates a cross-sectional view of yet another embodiment MEMS die; and FIG. 13 illustrates a cross-sectional view of a yet further embodiment MEMS die.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1:
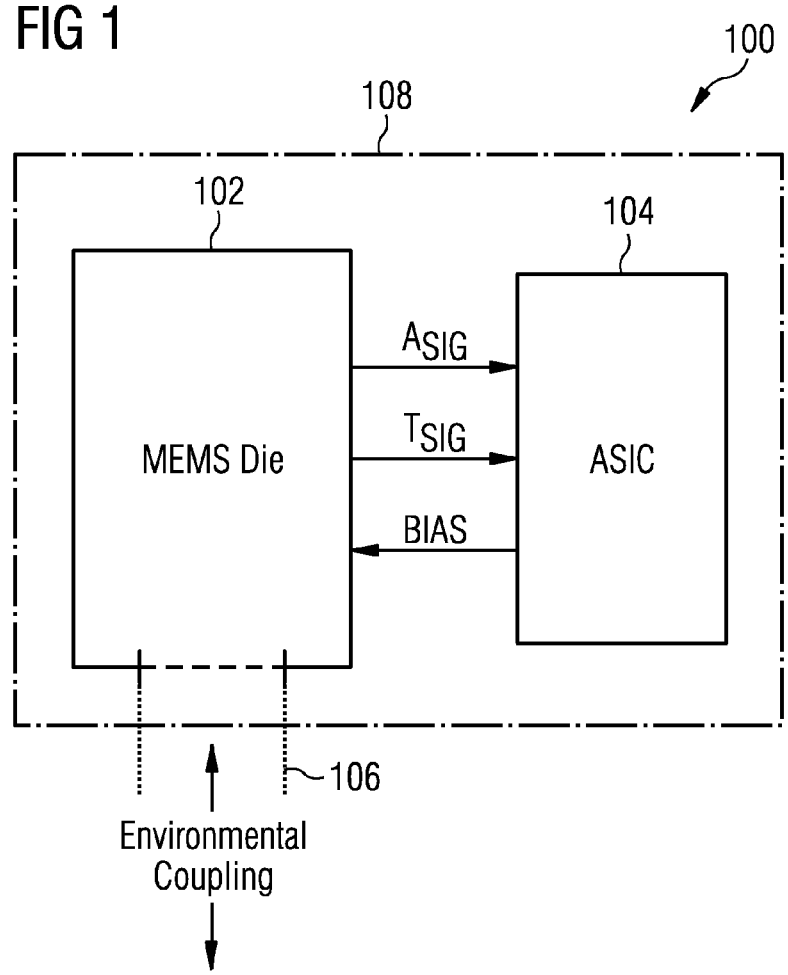
FIG. 1 illustrates a system block diagram of an embodiment sensor.

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Description is made with respect to various embodiments in a specific context, namely transducers, and more particularly, integrated MEMS microphones and temperature sensors. Some of the various embodiments described herein include MEMS transducer systems, MEMS microphone systems, MEMS sensors with both an acoustic transducer and a temperature sensor, and integrated temperature sensors including thermistors and resistance temperature detectors (RTDs). In other embodiments, aspects may also be applied to other applications involving any type of sensor or transducer according to any fashion known in the art.

In recent years mobile electronics have made great strides in offering additional functionality in a smaller form factor. The inclusion of sensors and increased processing power has transformed the usage of tablet computers and mobile phones, for example. Sensors including, for example, accelerometers, gyroscopes, high resolution cameras, light sensors, microphones, and even touch based sensors are often incorporated into various mobile electronics as a matter of course. At the same time, competition in consumer applications has led to substantial efforts to minimize form factor and increase aesthetic appeal for mobile devices while increasing function.

According to various embodiments described herein, and in accordance with the general trend described hereinabove, an integrated MEMS sensor including both an acoustic transducer, such as a microphone or microspeaker, and a temperature sensor on a single die is presented. Efforts have been made to include a useful thermometer in various devices. However, in various applications, thermometers are often influenced by immediate contact with application device and the user. For example, previous efforts may include temperature sensors connected to a printed circuit board (PCB) or a device case or housing. In such cases, the temperature sensor may generate a signal that is substantially affected by the heat generated by other components within the device, such as heat transferred through the PCB, or by heat from the user, such as the body temperature. In applications where information, i.e., the temperature, about the external environment surrounding the device and the user is desired, previous applications may include such thermal noise from the device or user. According to various embodiments, integrating a temperature sensor in a MEMS microphone and in contact with the sound port of the MEMS microphone places the temperature sensor in direct contact with the external environment while simultaneously minimizing the contact with thermal noise generating sources such as the user, such as when the sensor is connected to the case, or other electronic components, such as a processor attached to a PCB. In various embodiments, the temperature sensor may be integrated in the body of the substrate of the MEMS die, integrated on the surface of the substrate of the MEMS die, or integrated on any of the sensing plates of the MEMS microphone. Various details of such example embodiments are described further herein below in reference to the figures.

FIG. 1 illustrates a system block diagram of an embodiment sensor 100 including MEMS die 102 and application specific integrated circuit (ASIC) 104. According to various embodiments, MEMS die 102 includes an acoustic transducer and a temperature sensing element, which are both coupled through opening or sound port 106 to an environment external to sensor 100. The microphone includes first and second sense plates. In some embodiments, the microphone in MEMS die 102 includes a perforated rigid backplate and a deflectable membrane. Sound waves entering MEMS die 102 through sound port 106 cause the deflectable membrane to vibrate or move, thereby changing the separation distance between the membrane and the backplate and generating a transduced acoustic signal ASIG, which is supplied to ASIC 104. In further embodiments, the microphone is a dual backplate microphone that includes an additional perforated rigid backplate. In yet another embodiment, the microphone is implemented as any kind of membrane based acoustic transducer. For example, in some embodiments, the microphone may be implemented with a single membrane, such as for optical microphones or piezoelectric microphones. In such embodiments, the sensing mechanism may be non-capacitive such as, e.g., optical or piezoelectric. In still other embodiments, the MEMS die 102 includes a membrane based speaker, such as a MEMS microspeaker.

In various embodiments, the temperature sensing element in MEMS die 102 generates a temperature signal TSIG that is proportional to temperature and supplies temperature signal TSIG to ASIC 104. The temperature sensing element in MEMS die 102 is integrated in the same semiconductor as the microphone and may include numerous variations of sensing elements, as described further herein below. For example, the temperature sensing element may include a spreading resistance in the semiconductor substrate, a diode formed on the substrate surface or in the substrate, a thermistor formed on the substrate or on any of the sense plates of the microphone, a resistance temperature detector (RTD), or a thermocouple integrated in the microphone structure. In the various embodiments, MEMS die 102 may include additional contact pads for interfacing both the microphone and the temperature sensing element. The temperature sensing element may be formed in MEMS die 102 in order to be thermally coupled to the external environment through sound port 106. For example, the temperature sensing element may be formed in contact with the air in a cavity acoustically or fluidically coupled to sound port 106.

In various embodiments, ASIC 104 may supply a supply signal or bias voltage BIAS to MEMS die 102. ASIC 104 may be any type of integrated circuit in some embodiments.

In various embodiments, MEMS die 102 is formed as a single semiconductor die. Further, ASIC 104 may be formed as a single integrated circuit on a single semiconductor die. Package 108 may include a PCB with MEMS die 102 and ASIC 104 attached thereto. In other embodiments, ASIC 104 and MEMS die 102 may be integrated on a same substrate or a same semiconductor die. In the various embodiments, MEMS die 102 and ASIC 104 may be formed on a substrate that is a material other than a semiconductor, such as conductors or insulators, for example, and polymers in more specific examples. In some embodiments, ASIC 104 and MEMS die 102 are attached directly together in package 108, such as by flip chip bonding or wafer bonding.

As described further herein below, embodiment MEMS microphones may have a membrane and backplate, or two backplates, in direct contact with air, for example, passing through a sound port to the external environment. In some embodiments, the temperature sensing element is formed on the membrane or backplate and is also in direct contact with air from the external environment. In addition, the temperature sensing element may be separated from heat generating elements attached to a PCB supporting MEMS die 102 because the membrane or the backplate on or in which the temperature sensing element is formed is suspended from the substrate that reduces or eliminates heat transfer from the PCB. In some embodiments, similar benefits may occur for temperature sensing elements formed on or in the substrate of MEMS die 102.

Figure 2:
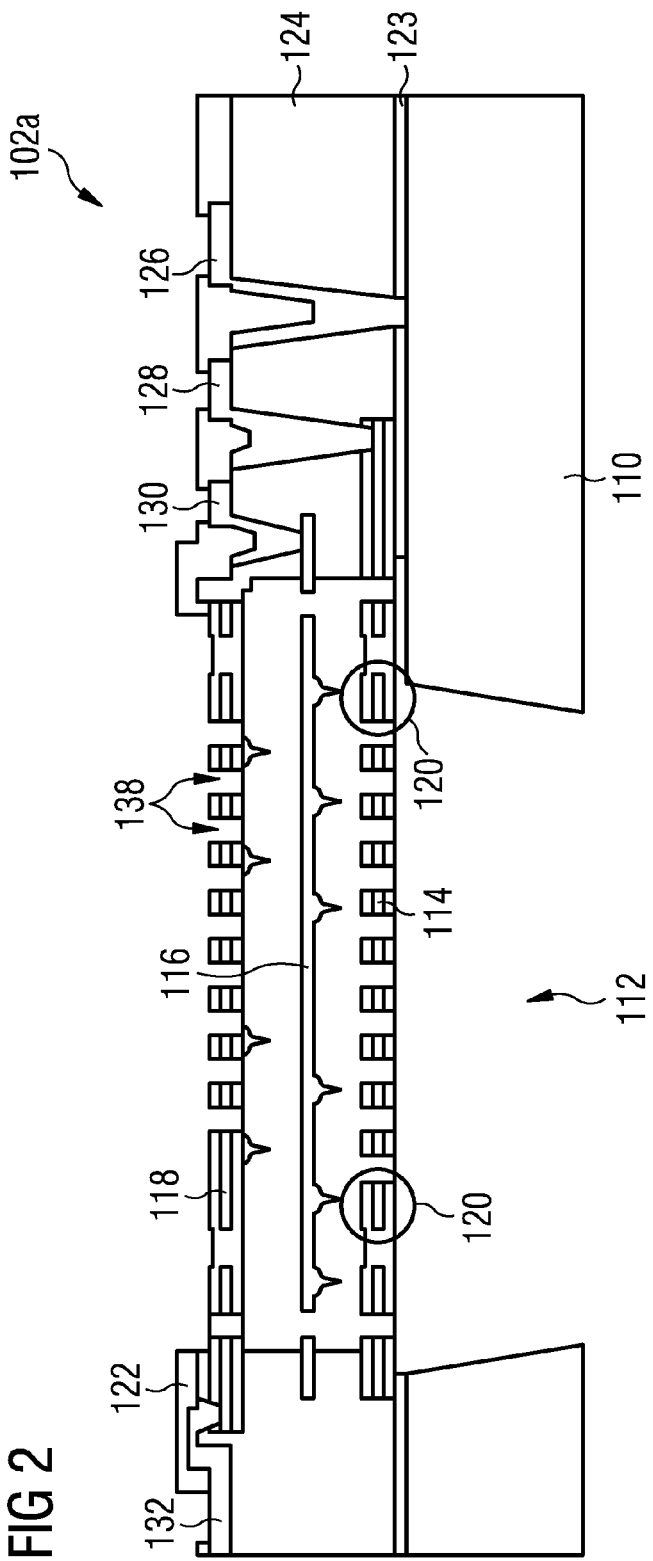
FIG. 2 illustrates a cross-sectional view of an embodiment MEMS die.

FIG. 2 illustrates a cross-sectional view of embodiment MEMS die 102a including a dual backplate microphone structure, which is one embodiment implementation of MEMS die 102 as described hereinabove in reference to FIG. 1. According to various embodiments, the dual backplate microphone is formed on substrate 110 over cavity 112 and includes bottom backplate 114, membrane 116, and top backplate 118. Top and bottom backplates 114 and 118 may be perforated rigid structures formed of multiple layers. In some embodiments, top and bottom backplates 114 and 118 each include a conductive layer formed between top and bottom insulating layers. In one particular embodiment, the conductive layer is formed of polysilicon and the top and bottom insulating layers are formed of silicon nitride (SiN). Other materials may be used in other embodiments. In some embodiments, membrane 116 may be formed of multiple layers, such as two or more layers including conductive and non-conductive materials.

According to some embodiments, bottom backplate 114 includes ring resistor 120 as a temperature sensing element. In particular embodiments, ring resistor 120 is formed of polysilicon surrounded by an insulating material, such as SiN. In some embodiments, ring resistor 120, which may be referred to as thermistor 120, may be formed as a semiconducting material, such as polysilicon, or may be formed as a metal. Ring resistor 120 may be formed in an active acoustic sensing area overlying cavity 112 or in an inactive sensing area overlying substrate 110. In other embodiments, ring resistor 120 may be formed as a temperature sensing element on membrane 116 or top backplate 118 (not shown).

In particular embodiments, the dual backplate microphone including bottom backplate 114, membrane 116, and top backplate 118 is formed in structural layers 123 and 124. Structural layers 123 and 124 may be tetraethyl orthosilicate (TEOS) or other patternable materials. Contact pads 126, 128, 130, and 132 provide electrical connection through structural layers 123 and 124 to substrate 110, bottom backplate 114, membrane 116, and top backplate 132, respectively. Contact pads 126, 128, 130, and 132 may be formed of a conductive material, such as a metal of semiconductor. Isolation or insulation layer 122 may also be formed over contact pads 126, 128, 130, and 132. Although not shown in FIG. 2, ring resistor 120 may be coupled to additional contact pads 134 and 136 formed in structural layer 124, as described further in reference to FIG. 3.

Figure 3:
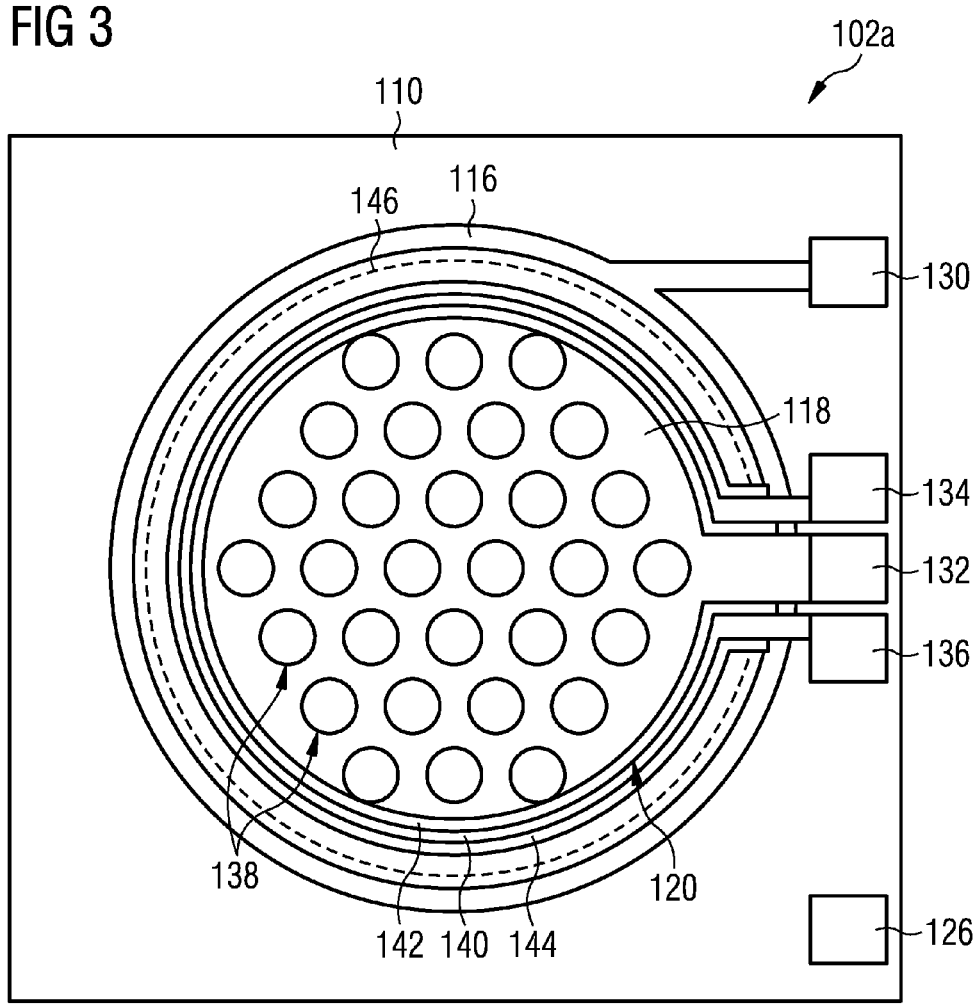
FIG. 3 illustrates a top view of the embodiment MEMS die.

FIG. 3 illustrates a top view of embodiment MEMS die 102a as described hereinabove in reference to FIG. 2. According to various embodiments, top backplate 118, membrane 116, and bottom backplate 114 (not shown) are formed over cavity 112 (not shown) on substrate 110. In such embodiments, ring resistor 120, which may also be referred to as thermistor 120, is shown formed in top backplate 118 between contact pads 134 and 136. Top backplate 118 includes perforations 138 and is electrically contacted by contact pad 132. Contact pad 126 is electrically connected to substrate 110 and contact pad 130 is electrically coupled to membrane 116. Structural layers 123 and 124 are left out for simplicity of illustration.

For simplicity of illustration, in FIG. 3 top backplate 118 is illustrated with ring resistor 120 formed as a portion of the backplate, e.g., formed in or on the backplate, whereas in FIG. 2 bottom backplate 114 is illustrated with ring resistor 120. In various embodiments, ring resistor 120 may be formed in or on top backplate 118 or bottom backplate 114. In further embodiments, ring resistors 120 may be formed on both top and bottom backplates 114 and 118. In some embodiments, ring resistor 120 may be formed on or in membrane 116.

According to some embodiments, ring resistor 120 includes conducting material 140 between insulating materials 142 and 144. In a particular embodiment, insulating materials 142 and 144 are SiN and conducting material 140 is polysilicon. In other embodiments, conducting material 140 may be formed of other semiconducting materials or metals, for example, and insulating materials 142 and 144 may be formed of other insulators, for example. In a specific embodiment, conductive material 140 is platinum. According to various embodiments, release line 146 delineates the released portion of membrane 116 and top backplate 118 from the fixed portion of membrane 116 and top backplate 118. In some embodiments, release line 146 delineates the active acoustic sensing area inside release line 146 from the inactive acoustic sensing area outside release line 146.

In various embodiments, ring resistor 120 may be a ring shaped structure as illustrated. In other embodiments, thermistor 120 may be formed in any shape as a line resistor or meander type resistor. In some embodiments, thermistor 120 may be formed as a meander type resistor running in circles or zigzags across either backplate or membrane. In an alternative embodiment, thermistor 120 may be a short line resistor placed in any portion of either backplate or membrane.

In various embodiments as described in reference to FIGS. 2 and 3, the resistance of ring resistor 120 may depend on temperature. A temperature is determined, or a temperature signal proportional to temperature is generated, by providing a voltage or current to ring resistor 120 at contact pads 134 and 136. The corresponding current or voltage is measured and the variation in resistance influences the measured current or voltage due to temperature variation. Using this information, the temperature may be determined. In some embodiments, a calibration sequence is performed in order to determine or characterize the relationship between measured signals from ring resistor 120 and the temperature. In such embodiments, signals on contact pads 134 and 136 are used to measure temperature of the external environment coupled to the temperature sensing element implemented as ring resistor 120.

Figure 4:
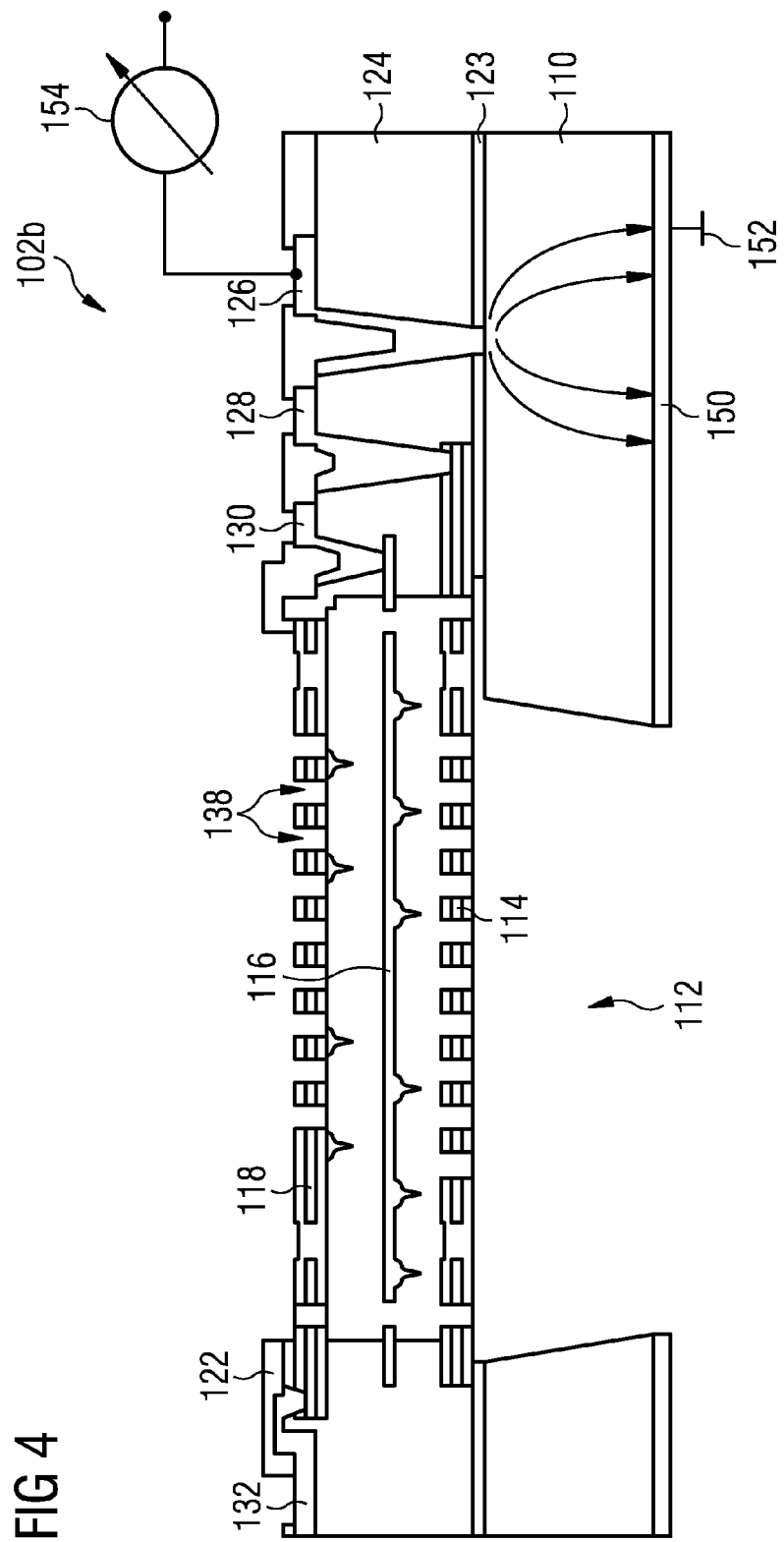
FIG. 4 illustrates a cross-sectional view of another embodiment MEMS die.

FIG. 4 illustrates a cross-sectional view of another embodiment MEMS die 102b including a dual backplate microphone structure, which is another embodiment implementation of MEMS die 102 as described hereinabove in reference to FIG. 1. According to various embodiments, MEMS die 102b includes similar layers and structures as described hereinabove in reference to FIGS. 2 and 3. Description in reference to MEMS die 102a also applies to identically numbered elements in MEMS die 102b with the exception that, in some embodiments, bottom backplate 114, membrane 116, and top backplate 118 do not include ring resistor 120. According to various embodiments, the temperature sensing element in MEMS die 102b is implemented as a spreading resistor in substrate 110. In such embodiments, the resistance of substrate 110 is also dependent on temperature. Variable supply 154 supplies a variable current or voltage and the corresponding voltage or current, respectively, between contact pad 126 and back contact 150 is measured. Back contact 150 is formed on a back portion of substrate 110 and contact 152 may be coupled to back contact 152 for measuring voltage or current between contact pad 126 and back contact 150.

Figure 5:
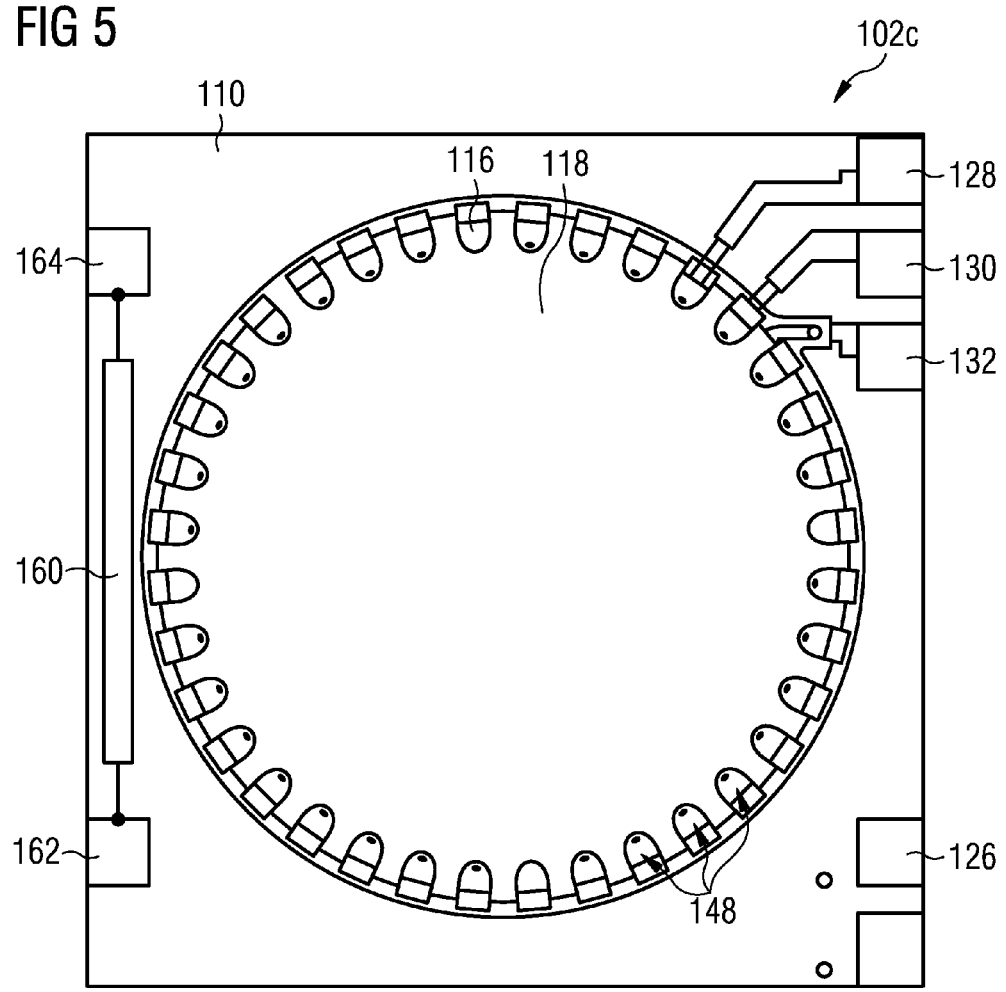
FIG. 5 illustrates a top view of a further embodiment MEMS die.

FIG. 5 illustrates a top view of a further embodiment MEMS die 102c including a dual backplate microphone structure, which is a further embodiment implementation of MEMS die 102 as described hereinabove in reference to FIG. 1. The dual backplate microphone structure includes top backplate 118, membrane 116, and bottom backplate 114 (not shown) formed on substrate 110. According to various embodiments, MEMS die 102c includes thermistor 160, which is formed on substrate 110 and coupled between contact pads 162 and 164. In such embodiments, top backplate 118, membrane 116, and bottom backplate 114 (not shown) operate as described hereinabove in reference to FIGS. 2 and 3. In some embodiments, top backplate 118, membrane 116, and bottom backplate 114 (not shown) do not include ring resistor 120 or contact pads for ring resistor 120.

In various embodiments, thermistor 160 is formed of a material with a resistance dependent on temperature. In some embodiments, thermistor 160 is formed as a metal, such as platinum for example. In other embodiments, thermistor 160 is formed as a semiconductor, such as polysilicon for example. Thermistor 160 may also be referred to as a resistance temperature detector (RTD) 160. In one specific embodiment, RTD 160 is formed of only metal, such has platinum or gold, for example. As described hereinabove in reference to FIGS. 3 and 4, in order to generate signals proportional to temperature a voltage or current if supplied to thermistor 160 at contact pads 162 and 164. The resulting current or voltage is measured in order to determine temperature variations causing resistance variations. In various embodiments, a calibration sequence may be performed as described hereinabove.

Figure 6:
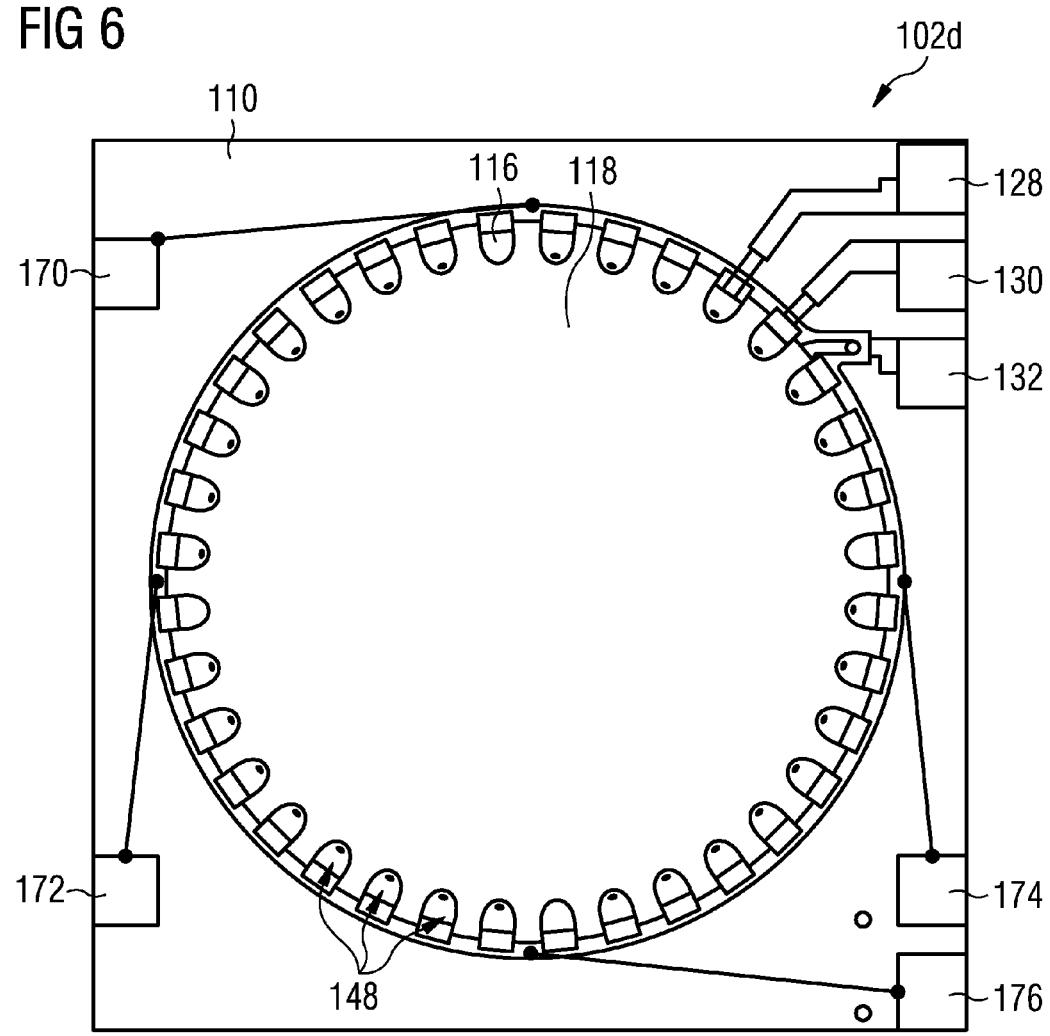
FIG. 6 illustrates a top view of a still further embodiment MEMS die.

FIG. 6 illustrates a top view of a still further embodiment MEMS die 102d including a dual backplate microphone structure, which is a still further embodiment implementation of MEMS die 102 as described hereinabove in reference to FIG. 1. According to various embodiments, the temperature sensing element of MEMS die 102d is the sheet resistance of one of the sense plates, i.e., top backplate 118, membrane 116, or bottom backplate 114 (not shown). Contact pads 170, 172, 174, and 176 are formed with electrical couplings to the sense plate used for measuring sheet resistance. Contact pads 170, 172, 174, and 176 are coupled to different portions of the sense plate.

According to various embodiments, the sheet resistance is determined using methods known in the art. As similarly described hereinabove, the resistance of the respective sense plate is dependent on temperature. Thus, a measurement is performed that uses resistance variations to determine temperature variations.

In some embodiments, top and bottom backplates 118 and 114 may include perforations, as shown in FIGS. 2, 3, and 4. In other embodiments, top and bottom backplates 118 and 114 do not include perforations, as shown in FIGS. 5 and 6. In specific embodiments, top and bottom backplates 118 and 114 may include ventilation ports 148 around the circumference of top and bottom backplates 118 and 114, as shown in FIGS. 5 and 6.

Figure 7:
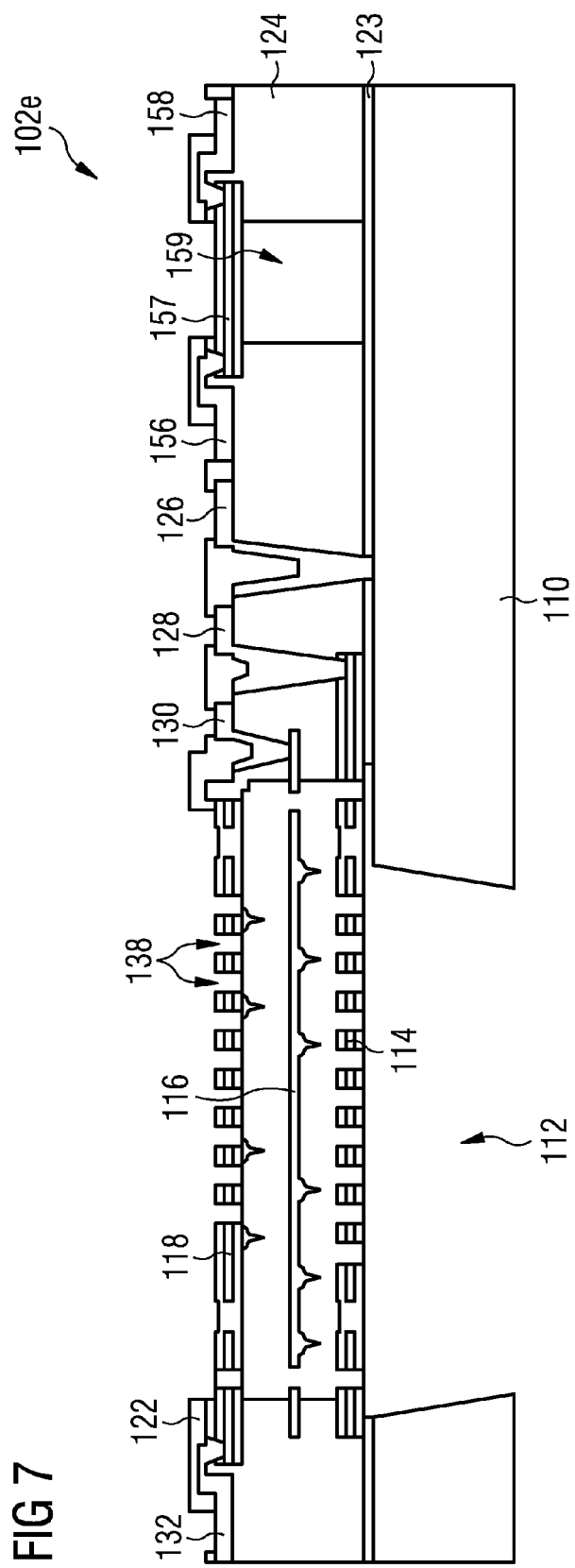
FIG. 7 illustrates a cross-sectional view of still another embodiment MEMS die.

FIG. 7 illustrates a cross-sectional view of still another embodiment MEMS die 102e including a dual backplate microphone structure, which is another embodiment implementation of MEMS die 102 as described hereinabove in reference to FIG. 1. According to various embodiments, MEMS die 102e includes similar layers and structures as described hereinabove in reference to FIGS. 2 and 3. Description in reference to MEMS die 102a also applies to identically numbered elements in MEMS die 102e with the exception that, in some embodiments, bottom backplate 114, membrane 116, and top backplate 118 do not include ring resistor 120. According to various embodiments, the temperature sensing element in MEMS die 102e is implemented as resistive element or thermistor 157 suspended over substrate 110. In such embodiments, the resistance of thermistor 157 is dependent on temperature. The resistance of thermistor 157 may be measured between contact pad 156 and back contact 158.

In various embodiments, thermistor 157 is formed over substrate 110 in gap 159 of structural layer 124. In some embodiments, thermistor may be formed of the same materials as top backplate 118 as described herein in reference to the other figures. Structural layers 123 and 124, thermistor 157, and contact pads 156 and 158 may be formed with surface micromachining techniques on substrate 110. In various embodiments, thermistor 157 is formed of a material with a resistance dependent on temperature. In some embodiments, thermistor 157 is formed as a metal, such as platinum for example. In other embodiments, thermistor 157 is formed as a semiconductor, such as polysilicon for example. Thermistor 157 may also be referred to as a resistance temperature detector (RTD) 157 in particular embodiments. In one specific embodiment, RTD 157 is formed of only metal, such has platinum or gold, for example. As described hereinabove in reference to FIGS. 3 and 4, in order to generate signals proportional to temperature a voltage or current if supplied to thermistor 157 at contact pads 156 and 158. The resulting current or voltage is measured in order to determine temperature variations causing resistance variations. In various embodiments, a calibration sequence may be performed as described hereinabove.

Figure 8:
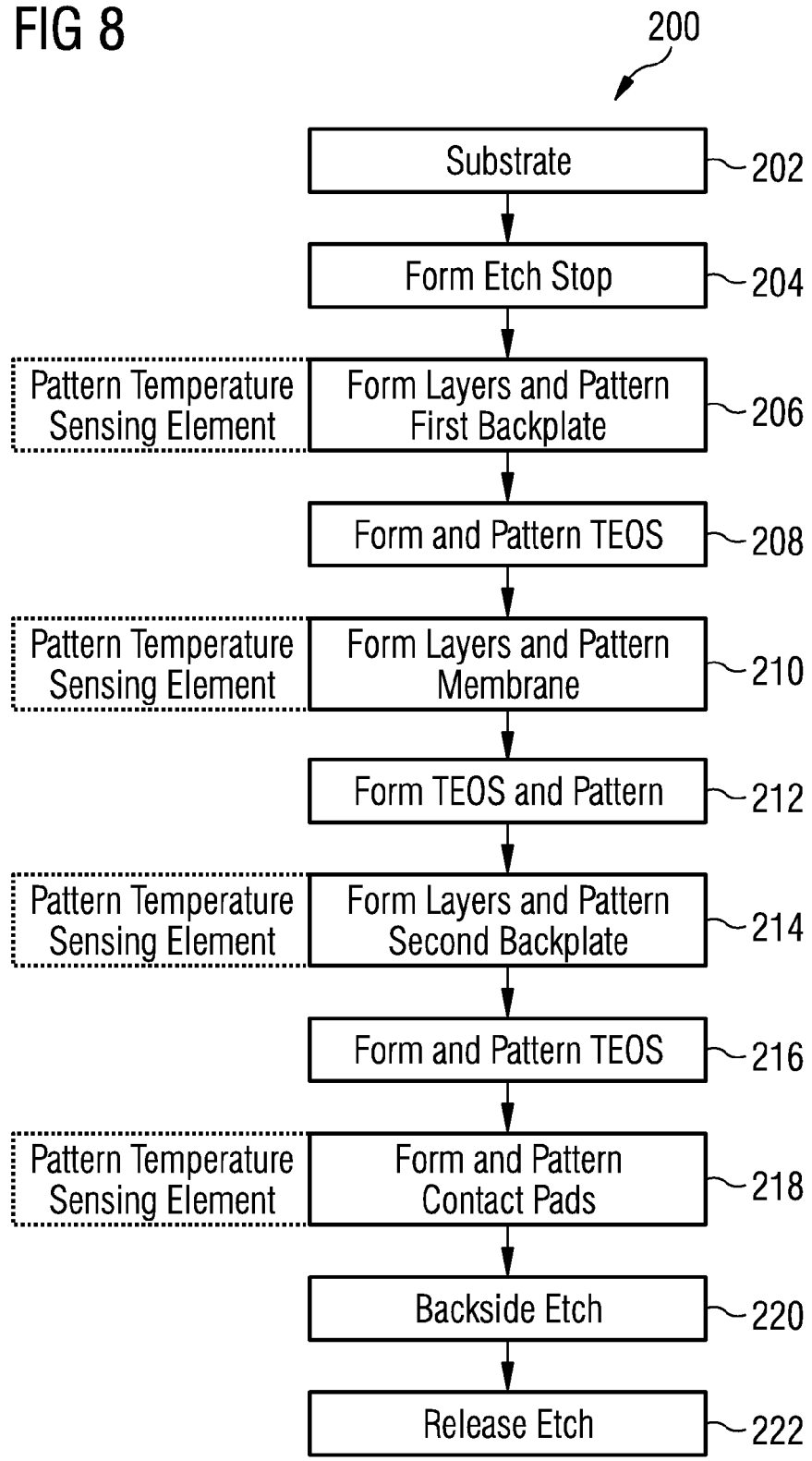
FIG. 8 illustrates a block diagram an embodiment fabrication process for a MEMS die.

FIG. 8 illustrates a block diagram of an embodiment fabrication process 200 for a MEMS die including steps 202-222. According to various embodiments, fabrication process 200 begins with a substrate in step 202. The substrate may be formed of a semiconductor, such as silicon, or as another material, such as a polymer for example. An etch stop layer is formed on the substrate in step 204. The etch stop layer may be tetraethyl orthosilicate (TEOS), for example. In step 206, a first backplate is formed by forming and patterning layers for the first backplate. As shown, in some embodiments, step 206 also includes forming a temperature sensing element in or on the first backplate. As an example, step 206 may include depositing an insulating layer, such as SiN, depositing a conducting layer, such as polysilicon, patterning the conducting layer, depositing another insulating layer, such as SiN, and patterning the resulting stack of layers. Patterning may include a photolithographic process to produce the first backplate structure with perforations and a thermistor formed in the backplate, for example, such as described hereinabove in reference to FIGS. 2 and 3.

In other embodiments, structure variations and material alternatives are envisioned. For example, the thermistor may be formed as an additional element on the first backplate and may be formed of metal. In some alternative embodiments, the first backplate may be formed of any number of layers, conductive or insulating. For example, in some embodiments, the first backplate may include layers of metals, semiconductors, or dielectrics. A dielectric layer may be used to separate the temperature sensing element from a microphone sensor. In one embodiment, a layer stack of dielectric materials and conductive materials on top of the first backplate may include the temperature sensing element, which is formed of a polysilicon or metal layer in such embodiments, for example. In some embodiments, the first backplate may be formed of silicon on insulator (SOI) or metal and dielectric layers. When the first backplate is patterned, the patterning may include a ring resistor or other structure formed in or on the first backplate in different embodiments.

In various embodiments, step 208 includes forming and patterning a structural material, such as TEOS. Forming and patterning in step 208 is performed in order to provide spacing for a membrane. The structural layer may be patterned in order to form anti-stiction bumps for the membrane. In addition, the structural layer formed in step 208 may include multiple depositions and a planarization step, such as a chemical mechanical polish (CMP). Step 210 includes forming the membrane layer and patterning the membrane. The membrane layer may be formed of polysilicon, for example. In other embodiments, the membrane layer may be formed of other conductive materials, such as a doped semiconductor or a metal, for example. Patterning the membrane layer in step 210 may include a photolithographic process, for example, that defines the membrane shape or structure. The membrane may include anti-stiction bumps based on the structure formed in step 208. In some embodiments, as shown, the membrane formed in step 210 may also include a sensing element formed in or on the membrane layer or layers. In particular embodiments, the membrane may be formed of multiple layers and a thermistor may be formed in or on the membrane layers. In various embodiments, the membrane may be formed with a temperature sensing element according to any configuration of material layers as described hereinabove in reference to the first backplate formed in step 206, for example.

In various embodiments, step 212 includes forming and patterning additional structural material, such as TEOS. Similar to step 208, the structural material may be formed and patterned in step 212 to space a second backplate from the membrane and provide anti-stiction bumps in the second backplate. Step 214 includes forming and patterning the layers of the second backplate. In some embodiments, forming and patterning in step 214 includes deposition of layers and photolithographic patterning, for example. In various embodiments, step 214 may include similar features as described hereinabove in reference to the first backplate formed in step 206 and the same description applies. Thus, in various embodiments, step 214 may include forming a temperature sensing element, such as a thermistor, in or on the second backplate, as shown. Step 214 may also include forming a resistive element or thermistor on the structural material of step 212. The thermistor may include any material as described in reference to thermistor 157, for example. In a particular embodiment, the thermistor may be formed of the same layers of the second backplate. An additional step may be added to fabrication process 200 (not shown) to form a gap, such as by etching, in the structural material between the thermistor and the substrate of step 202, such as described hereinabove in reference to FIG. 7.

Following step 214, step 216 includes forming and patterning additional structural material in various embodiments. The structural material may be TEOS. In some embodiments, the structural material is deposited as a sacrificial material or a masking material for subsequent etch or patterning steps. Step 218 includes forming and patterning contact pads. Forming and patterning the contact pads in step 218 may include etching contact holes in the existing layers to provide openings to the second backplate, membrane, first backplate, substrate, and temperature sensing element. In a specific embodiment, the temperature sensing element is a thermistor that may have two openings for two contact pads to whichever structure the thermistor is formed on or in. After forming the openings to each respective structure or layer, the contact pads may be formed by depositing a conductive material, such as a metal, in the openings and patterning the conductive material to form separate contact pads. Step 218 may also include forming a temperature sensing element in metallization layers or between contact pads. For example, a resistive element with a resistance dependent on temperature may be formed between additional contact pads. In one specific embodiment, a platinum wire is formed between contact pads in step 218. In a still further embodiment, step 218 may also include forming a back contact for measuring a spreading resistance of the substrate as described hereinabove in reference to FIG. 4.

In various embodiments, step 220 includes performing a backside etch, such as a Bosch etch. The backside etch forms a cavity in the substrate in order to form a sound port to the fabricated microphone and temperature sensor or to form a reference cavity. Step 222 includes performing a release etch to remove the structural materials protecting and securing the first backplate, membrane, and second backplate. Following the release etch in step 222, the membrane may be free to move in some embodiments.

In some alternative embodiments, a diode may be formed as the temperature sensing element on the first backplate, the second backplate, or the membrane. Fabrication process 200 may be modified in specific embodiments to include only a single backplate and membrane. Those of skill in the art will readily appreciate that numerous modifications may be made to the general fabrication sequence described hereinabove in order to provide various benefits and modifications known to those of skill in the art while still including various embodiments of the present invention. In some embodiments, fabrication sequence 200 may be implemented to form a microspeaker having a similar structure as a single backplate MEMS microphone, for example.

Figure 9:
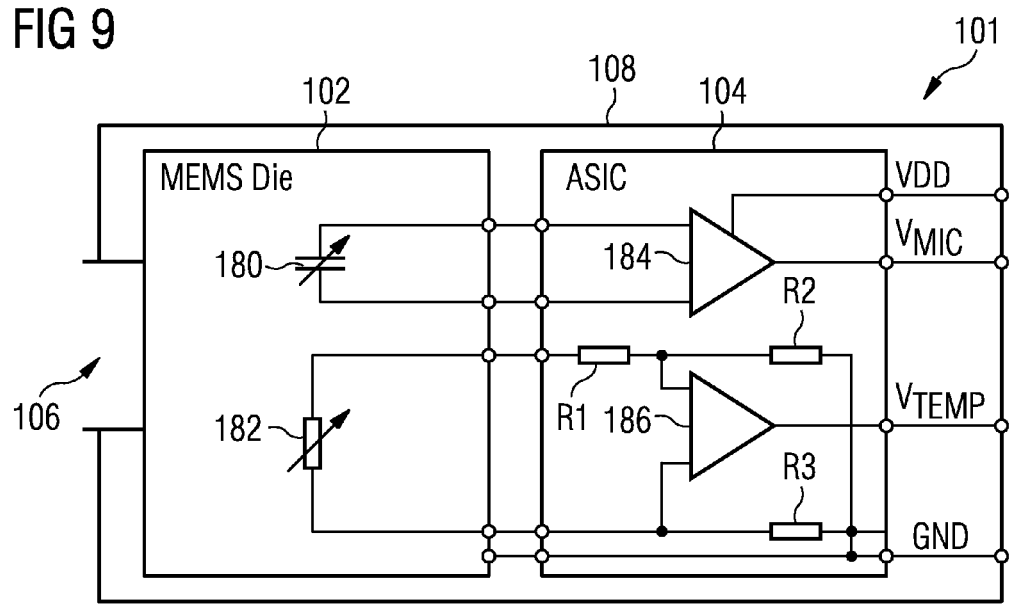
FIG. 9 illustrates a schematic of an embodiment sensor system.

FIG. 9 illustrates a schematic of an embodiment sensor system 101 including MEMS die 102 and ASIC 104 in package 108. According to various embodiments, MEMS die 102 includes microphone 180 and thermistor 182, as similarly described hereinabove, and ASIC 104 includes opamp 184 coupled to microphone 180 and opamp 186 coupled to thermistor 182. In various embodiments, thermistor 182 may be implemented as any other types of temperature sensing elements as described hereinabove. Opamp 184 generates microphone output voltage VMIC based on transduced signals received from microphone 180 and opamp 186 generates temperature output voltage VTEMP based on temperature signals received from thermistor 182. In some embodiments, the first input of opamp 186 is supplied through a resistive divider circuit including resistors R1 and R2 and the second input of opamp 186 is supplied through reference to low supply voltage GND through resistor R3. Opamp 184 may receive a supply voltage VDD. Each of supply voltage VDD, microphone output voltage VMIC, temperature output voltage VTEMP, and low supply voltage GND may be coupled to off chip structures through pins, such as to a PCB, or may be coupled to other element in ASIC 104.

In various embodiments, ASIC 104 may include numerous interface circuits and opamps 184 and 186 are merely one example. Those of skill in the art will readily appreciate that the interface circuits for microphone 180 and thermistor 182 included in ASIC 104 may be implemented with multiple variations and modifications. Further, ASIC 104 may include various biasing circuits, pull-in or error detection, or circuits for implementing other functionality. In various embodiments, microphone 180 and thermistor 182 are coupled to an external environment through sound port 106.

Figure 10:
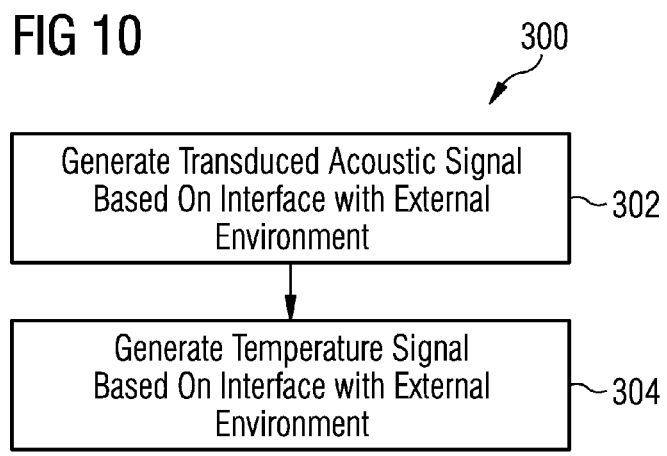
FIG. 10 illustrates a block diagram of an embodiment method of operation.

FIG. 10 illustrates a block diagram of an embodiment method of operation 300 including steps 302 and 304. According to various embodiments, method of operation 300 is a method of operating a sensor. Step 302 includes generating a transduced acoustic signal based on an interface with an external environment and step 304 includes generating a temperature signal based on the interface with the external environment. In such embodiments, both the transduced acoustic signal and the temperature signal are generated at a same single microfabricated die. In specific embodiments, the transduced acoustic signal and the temperature signal are generated in a MEMS microphone with an integrated temperature sensing element. Method of operation 300 may include additional steps in some embodiments.

FIG. 11 illustrates a system block diagram of an embodiment electronic system 400 including MEMS die 402, IC 404, processor 408, and communication circuit 410. According to various embodiments, electronic system 400 may be a mobile electronic device, such as a tablet computer or a mobile phone. MEMS die 402 functions as similarly described hereinabove in reference to MEMS die 102. MEMS die 402 includes a MEMS microphone and a temperature sensing element integrated on a single die and coupled to an external environment through sound port 406, as similarly described in reference to sound port 106. MEMS die 402 is also coupled to IC 404, which may function as described hereinabove in reference to ASIC 104. In alternative embodiments, IC 404 is also integrated on MEMS die 402.

In various embodiments, MEMS die 402 is coupled to PCB 412 and contained inside case 416. For example, case 416 may be the body of a tablet computer or a mobile phone. Display 414 may also be coupled to PCB 412. In some embodiments, processor 408 and communication circuit 410 are coupled to PCB 412. Communication circuit 410 communicates through communication pathway 418, which is a wireless communication pathway. In an alternative embodiment, communication pathway 418 is a wired connection.

In various embodiments, MEMS die 402 generates transduced acoustic signals and temperature signals from an external environment outside case 416 and provides the generated signals through IC 404 and PCB 412 to processor 408. In alternative embodiments, electronic system 400 is a wired device, such as a workstation, personal computer, or a computing system for a specific application, such as industrial, medical, or aerospace application, for example.

FIG. 12 illustrates a cross-sectional view of yet another embodiment MEMS die 500. According to various embodiments, MEMS die 500 is a piezoresistive or piezoelectric transducer that includes substrate 502, structural material 504, membrane 506, and cavity 512. Disposed on membrane 506 or included within it are piezo-transducers 510. Piezo-transducers 510 may be implemented as a piezoelectric material or a piezoresistive material.

In various embodiments, pressure changes or acoustic signals in the ambient environment cause deflections of membrane 506. For a piezoresistive material, the deflections change the resistance of piezo-transducers 510 and the resistance is measured by readout electrodes (not shown). For a piezoelectric material, the deflections cause piezo-transducers 510 to generate a voltage that is supplied to readout electronics (not shown).

According to various embodiments, MEMS die 500 also includes a temperature sensing element. A temperature sensing element may be implemented as resistive element 508, which may be formed on any portion of membrane 506. For example, resistive element 508 may implement a temperature sensing element as described hereinabove in reference to ring resistor 120 in FIGS. 2 and 3. In another embodiment, resistive element 514 may be formed over gap 516 in order to implement a temperature sensing element as described hereinabove in reference to resistive element 157 in FIG. 7. In some embodiments, gap 516 may be omitted and resistive element 514 may be formed on structural material 504 or directly on substrate 502. Various further modifications and configurations using piezo-transducers are possible. One of ordinary skill in the art will appreciate that such modifications and configurations using integrated temperature sensing elements as described herein are included within the scope of the various embodiments.

FIG. 13 illustrates a cross-sectional view of a yet further embodiment MEMS die 520. According to various embodiments, MEMS die 520 is an optical transducer that includes substrate 522, backplate 524, structural layer 526, membrane 528, and cavity 536. Laser 532 and photodiodes 534 are disposed on substrate 522, which is spaced from backplate 524 by air gap 544. Backplate 524 includes or supports diffraction grating 538. In such embodiments, laser 532 emits an optical beam towards diffraction grating 538 and membrane 528. Backplate 524 may be supported by a spacer or substrate (not shown) on substrate 522 that provides the structure for air gap 544.

In various embodiments, pressure changes or acoustic signals in the ambient environment cause deflections or vibrations of membrane 528. Vibrations of membrane 528 affect the distance between diffraction grating 538 and membrane 528, which in turn modulates the intensity of the light emitted back towards photodiodes 534. Thus, photodiodes 534 generate electronic signals related to the deflections of membrane 528. Various modifications or alternative configurations for optical MEMS transducers are known to those skilled in the art and such modifications are included in various embodiments.

According to various embodiments, MEMS die 520 also includes a temperature sensing element. A temperature sensing element may be implemented as resistive element 530, which may be formed on any portion of membrane 528. For example, resistive element 530 may implement a temperature sensing element as described hereinabove in reference to ring resistor 120 in FIGS. 2 and 3. In another embodiment, resistive element 540 may be formed over gap 542 in order to implement a temperature sensing element as described hereinabove in reference to resistive element 157 in FIG. 7. Gap 542 may be formed in structural layer 526 or in the material or structure of backplate 524. In some embodiments, gap 542 may be omitted and resistive element 540 may be formed on structural layer 526 or directly on the material or structure of backplate 524. Various further modifications and configurations using optical transducers are possible. One of ordinary skill in the art will appreciate that such modifications and configurations using integrated temperature sensing elements as described herein are included within the scope of the various embodiments.

In various embodiments described herein, reference is made primarily to a dual backplate MEMS microphone. In additional embodiments, a single backplate MEMS microphone includes various embodiment integrated temperature sensing elements. One of skill in the art will readily appreciate how the structures described herein in reference to a dual backplate MEMS microphone may be modified according to a single backplate microphone structure. Further, in some embodiments, non-capacitive based acoustic sensors may be integrated with a temperature sensing element. For example, piezoelectric or optical microphones may be implemented with integrated temperature sensing elements as described herein. In addition, electret microphones may also be included in embodiments described herein. In further alternative embodiments, other MEMS sensors may include integrated temperature sensors as described herein, such as MEMS with deflectable sensing structures with integrated temperature sensing elements in the sensing structure, for example. In one embodiment, a MEMS based microspeaker may include an integrated temperature sensing element in a substrate or in a deflectable membrane of the microspeaker itself.

According to an embodiment, a transducer includes a microfabricated element integrated on a single die, the microfabricated element including an acoustic transducer and a temperature sensor. The transducer also includes an interface IC coupled to the microfabricated element and electrically coupled to the acoustic transducer and the temperature sensor. Other embodiments of this aspect include corresponding systems or apparatus configured to perform the actions, or steps, of corresponding methods.

Implementations may include one or more of the following features. In various embodiments, the acoustic transducer includes a microphone and the microphone includes a sound port, a membrane with a first active area acoustically coupled to the sound port, and a first backplate spaced from and aligned with the membrane. The first backplate may include a second active area spaced from and aligned with the first active area. In some embodiments, the microphone further includes a second backplate spaced from and aligned with the membrane, where the second backplate is spaced from the membrane in a direction opposite the first backplate. The temperature sensor may be formed on the backplate in the second active area or on the membrane in the first active area.

In various embodiments, the temperature sensor includes a resistive material formed on the backplate or the membrane between a first contact and a second contact. The resistive material is formed with a length and a width, where the length is at least five times greater than the width. In an embodiment, the resistive material includes a metal or a semiconductor. The temperature sensor may be formed on the backplate outside of the second active area or on the membrane outside of the first active area. In an embodiment, the microfabricated element includes a substrate and the temperature sensor is formed in the substrate. In another embodiment, the microfabricated element includes a substrate and the temperature sensor includes a resistive element formed on the substrate between two contact pads. In one embodiment, the resistive element includes a metal or a semiconductor material. In a further embodiment, the microfabricated element includes a substrate and a structural layer with a gap over the substrate, and the temperature sensor includes a resistive element formed on the structural layer and across the gap in the structural layer between two contact pads.

In various embodiments, the temperature sensor includes one of a thermistor, a resistance temperature detector (RTD), a thermocouple, and a diode. The temperature sensor may include a sense plate of the acoustic transducer, where the sense plate is configured with contacts for measuring sheet resistance of the sense plate. In an embodiment, the acoustic transducer includes a microspeaker. In some embodiments, the interface IC is integrated on the single die. In various embodiments, the acoustic transducer includes a piezoelectric transducer, a piezoresistive transducer, or an optical transducer. In some embodiments, the interface with the external environment includes a sound port coupled to the single microfabricated die.

According to an embodiment, a method of operating a sensor includes generating, at a single microfabricated die, a transduced acoustic signal based on an interface with an external environment, and also includes generating, at the single microfabricated die, a temperature signal based on the interface with the external environment. Other embodiments of this aspect include corresponding systems or apparatus, each configured to perform the actions, or steps, of corresponding methods.

Implementations may include one or more of the following features. In various embodiments, the interface with the external environment includes a sound port coupled to the single microfabricated die. The single microfabricated die may include a substrate, a membrane supported by the substrate and acoustically coupled to the interface with the external environment, and a sense plate spaced from and aligned with the membrane. In some embodiments, the single microfabricated die includes a temperature sensor formed on the membrane or the sense plate.

In various embodiments, generating the transduced acoustic signal includes generating a voltage signal between the sense plate and the membrane that varies based on acoustic signals incident on the membrane. In some embodiments, generating the temperature signal includes generating a signal proportional to a resistance of a temperature dependent resistive element.

According to an embodiment, a transducer includes a support structure including an opening to an external environment, a membrane acoustically coupled to the opening, a backplate spaced from and aligned with the membrane, and a temperature sensing element formed on the membrane or the backplate. Other embodiments of this aspect include corresponding systems or apparatus, each configured to perform the actions, or steps, of corresponding methods.

Implementations may include one or more of the following features. In various embodiments, the temperature sensing element includes a resistive material formed on the backplate or the membrane between a first contact and a second contact. In such embodiments, the resistive material is formed with a length and a width, where the length is at least five times greater than the width. In some embodiments, the resistive material includes a metal or a semiconductor. The support structure includes a substrate, and the membrane and the backplate are formed on the substrate. The opening may include a cavity in the substrate, and the membrane and the backplate may be formed over the cavity.

In various embodiments, the backplate includes a plurality of materials, the materials arranged to electrically isolate an active acoustic sensing area from an inactive acoustic sensing area. In some embodiments, the temperature sensing element is formed on the active acoustic sensing area of the backplate. In an embodiment, the membrane includes a plurality of materials and the temperature sensing element is formed on the membrane. In one embodiment, the transducer includes a microspeaker, where the microspeaker includes the membrane and the backplate.

According to an embodiment, an electronic device includes a case including an opening configured to allow fluid communication through the opening, a microfabricated transducer integrated on a single die inside the case, a wired or wireless communication circuit inside the case, and a processor inside the case. The microfabricated transducer includes an acoustic transducer and a temperature sensor, and the microfabricated transducer is fluidically coupled to the opening. Further, the processor is coupled to the microfabricated transducer and the wired or wireless communication circuit. Other embodiments of this aspect include corresponding systems or apparatus, each configured to perform the actions, or steps, of corresponding methods.

According to an embodiment, an integrated device includes a microfabricated element integrated on a single die. The microfabricated element includes a substrate, a structural layer with a gap over the substrate, two contact pads, and a temperature sensor including a resistive element formed on the structural layer and across the gap in the structural layer between the two contact pads. Other embodiments of this aspect include corresponding systems or apparatus, each configured to perform the actions, or steps, of corresponding methods.

Implementations may include one or more of the following features. In various embodiments, the microfabricated element further includes an acoustic transducer integrated on the single die. In an embodiment, the integrated device further includes an interface IC coupled to the microfabricated element and electrically coupled to the acoustic transducer and the temperature sensor.

According to an embodiment, a method of fabricating a transducer includes forming a deflectable membrane over a substrate and forming a temperature sensing element at the substrate. Other embodiments of this aspect include corresponding systems or apparatus, each configured to perform the actions, or steps, of corresponding methods.

Implementations may include one or more of the following features. In various embodiments, forming the temperature sensing element includes forming a resistive layer on the membrane between two contact pads. In some embodiments, the method further includes forming a backplate over the substrate spaced from and aligned with the membrane. In an embodiment, forming the temperature sensing element includes forming a resistive layer on the backplate between two contact pads.

In various embodiments, forming the temperature sensing element includes forming the temperature sensing element in the substrate. In other embodiments, forming the temperature sensing element includes forming the temperature sensing element on the substrate. Forming the temperature sensing element may include forming a structural layer with a gap over the substrate and forming a resistive element on the structural layer and across the gap in the structural layer.

According to various embodiments described herein, advantages may include added functionality in a microfabricated acoustic sensor, reduced form factor for a system including a microphone and a temperature sensor, and improved environmental temperature sensing with decreased thermal noise. In some embodiments, one advantage may include fast and precise measurement of external air temperature due to a close coupling with the external environment. Some embodiments include an advantage wherein no additional silicon area is required due to integrating a temperature sensing element in the MEMS microphone die instead of elsewhere in the application system.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A transducer comprising:
    a microfabricated element integrated as part of a single die comprising a monolithic semiconductor substrate, the microfabricated element comprising an acoustic transducer and a temperature sensor, wherein the acoustic transducer and the temperature sensor are disposed on a first side of the monolithic semiconductor substrate, wherein the acoustic transducer comprises a microphone, the microphone comprising a membrane and a first backplate disposed over the monolithic semiconductor substrate, and wherein the temperature sensor comprises a resistor formed in the membrane or the first backplate; and
    an interface integrated circuit (IC) coupled to the microfabricated element and electrically coupled to the acoustic transducer and the temperature sensor.

2. The transducer of claim 1, wherein the microphone further comprises:
    a sound port;
    the membrane comprising a first active area acoustically coupled to the sound port; and
    the first backplate spaced from and aligned with the membrane in a first direction, wherein the first backplate comprises a second active area spaced from and aligned with the first active area in the first direction.

3. The transducer of claim 2, wherein the microphone further comprises a second backplate spaced from and aligned with the membrane in the first direction, the second backplate being on an opposite side of the membrane as the first backplate.

4. The transducer of claim 2, wherein the temperature sensor is formed on the first backplate in the second active area.

5. The transducer of claim 2, wherein the temperature sensor is formed on the first backplate outside of the second active area or on the membrane outside of the first active area.

6. The transducer of claim 2, wherein the temperature sensor is formed on the membrane in the first active area.

7. The transducer of claim 1, wherein the resistor is formed on the first backplate or the membrane between a first contact and a second contact, wherein the resistor has a length and a width, and wherein the length is at least five times greater than the width.

8. The transducer of claim 7, wherein the resistor comprises a metal or a semiconductor.

9. The transducer of claim 1, wherein the resistor is formed on the monolithic semiconductor substrate between two contact pads.

10. The transducer of claim 9, wherein the resistor comprises a metal or a semiconductor material.

11. The transducer of claim 1, wherein
    the microfabricated element comprises a structural layer with a gap over the monolithic semiconductor substrate, and
    the resistor is formed on the structural layer and across the gap in the structural layer between two contact pads.

12. The transducer of claim 1, wherein the temperature sensor comprises one of a thermistor, a resistance temperature detector (RTD), a thermocouple, and a diode.

13. The transducer of claim 1, wherein the temperature sensor comprises a sense plate of the acoustic transducer, wherein the sense plate is configured with contacts for measuring sheet resistance of the sense plate.

14. The transducer of claim 1, wherein the acoustic transducer comprises a microspeaker.

15. The transducer of claim 1, wherein the interface IC is integrated on the single die.

16. The transducer of claim 1, wherein the acoustic transducer comprises a piezoelectric transducer, a piezoresistive transducer, or an optical transducer.

17. A method of operating a sensor, the method comprising:
    generating, at an acoustic transducer disposed on a first side of a monolithic semiconductor substrate of a single microfabricated die, a transduced acoustic signal based on an interface with an external environment; and
    generating, at a temperature sensor disposed on the first side of the monolithic semiconductor substrate of the single microfabricated die, a temperature signal based on the interface with the external environment, wherein the acoustic transducer comprises a microphone, the microphone comprising a membrane and a sense plate disposed over the monolithic semiconductor substrate, and wherein the temperature sensor comprises a resistor formed in the membrane or the sense plate.

18. The method of claim 17, wherein the interface with the external environment comprises a sound port coupled to the single microfabricated die.

19. The method of claim 17, wherein the single microfabricated die comprises:
the membrane being supported by the monolithic semiconductor substrate and acoustically coupled to the interface with the external environment; and
the sense plate spaced from and aligned with the membrane.

20. The method of claim 19, wherein the single microfabricated die comprises the temperature sensor formed on the membrane or the sense plate.

21. The method of claim 19, wherein generating the transduced acoustic signal comprises generating a voltage signal between the sense plate and the membrane that varies based on acoustic signals incident on the membrane.

22. The method of claim 17, wherein generating the temperature signal comprises generating a signal proportional to a resistance of a temperature dependent resistive element of the resistor.

23. A transducer comprising:
a support structure comprising a monolithic semiconductor substrate, and an opening to an external environment, the opening being made through the monolithic semiconductor substrate;
a membrane acoustically coupled to the opening and aligned with the opening in a first direction, the membrane disposed over the monolithic semiconductor substrate;
a backplate spaced from and aligned with the membrane and the opening in the first direction, the backplate disposed over the monolithic semiconductor substrate; and
a temperature sensing element formed on the membrane or the backplate.

24. The transducer of claim 23, wherein the temperature sensing element comprises a resistor formed on the backplate or the membrane between a first contact and a second contact, the resistor being formed with a length and a width, wherein the length is at least five times greater than the width.

25. The transducer of claim 24, wherein the resistor comprises a metal or a semiconductor.

26. The transducer of claim 23, wherein the membrane and the backplate are formed on the monolithic semiconductor substrate.

27. The transducer of claim 26, wherein the opening comprises a cavity in the monolithic semiconductor substrate, wherein the membrane and the backplate are formed over the cavity.

28. The transducer of claim 23, wherein the backplate comprises a plurality of materials, the materials arranged to electrically isolate an active acoustic sensing area from an inactive acoustic sensing area.

29. The transducer of claim 28, wherein the temperature sensing element is formed on the active acoustic sensing area of the backplate.

30. The transducer of claim 23, wherein the membrane comprises a plurality of materials and the temperature sensing element is formed on the membrane.

31. The transducer of claim 23, wherein the transducer comprises a microspeaker, the microspeaker comprising the membrane and the backplate.

32. An electronic device comprising:
a case comprising an opening configured to allow fluid communication through the opening;
a microfabricated transducer integrated on a first surface of a monolithic semiconductor substrate within a single die inside the case, wherein the microfabricated transducer comprises an acoustic transducer and a temperature sensor formed on a structural layer, wherein the acoustic transducer and the temperature sensor are aligned with each other in a direction that is normal to the first surface of the monolithic semiconductor substrate, and wherein the microfabricated transducer is fluidically coupled to the opening;
a wired or wireless communication circuit inside the case; and
a processor inside the case, the processor coupled to the microfabricated transducer and the wired or wireless communication circuit.

33. An integrated device comprising:
a microfabricated element integrated on a monolithic semiconductor substrate within a single die, wherein the microfabricated element comprises
a structural layer with a gap over the monolithic semiconductor substrate,
two contact pads disposed over the monolithic semiconductor substrate,
a temperature sensor comprising a resistive element formed on a first side of the structural layer and across the gap in the structural layer between the two contact pads, and
an acoustic transducer formed on the first side of the structural layer and across the gap in the structural layer.

34. The integrated device of claim 33, further comprising an interface integrated circuit (IC) coupled to the microfabricated element and electrically coupled to the acoustic transducer and the temperature sensor.

35. The integrated device if claim 33, wherein the acoustic transducer comprises a backplate formed across the gap in the structural layer, and wherein the temperature sensor is disposed on the backplate.

36. A method of fabricating a transducer, the method comprising:
forming a deflectable membrane over a first side of a monolithic semiconductor substrate;
forming a backplate over the monolithic semiconductor substrate spaced from and aligned with the deflectable membrane; and
forming a temperature sensing element at the first side of the monolithic semiconductor substrate on the deflectable membrane or the backplate, wherein the deflectable membrane is formed directly over the temperature sensing element.

37. The method of claim 36, wherein forming the temperature sensing element comprises forming a resistive layer on the deflectable membrane between two contact pads.

38. The method of claim 36, wherein forming the temperature sensing element comprises forming a resistive layer on the backplate between two contact pads.

39. The method of claim 36, wherein forming the temperature sensing element comprises forming the temperature sensing element in the monolithic semiconductor substrate.

40. The method of claim 36, wherein forming the temperature sensing element comprises forming the temperature sensing element on the monolithic semiconductor substrate.

41. The method of claim 36, wherein forming the temperature sensing element comprises
forming a structural layer with a gap over the monolithic semiconductor substrate, and
forming a resistive element on the structural layer and across the gap in the structural layer.

* * * * *